United States Patent
Inoue et al.

(10) Patent No.: US 10,141,283 B2
(45) Date of Patent: Nov. 27, 2018

(54) SINTERABLE BONDING MATERIAL AND SEMICONDUCTOR DEVICE USING THE SAME

(71) Applicants: HENKEL AG & CO. KGAA, Duesseldorf (DE); HENKEL IP & HOLDING GMBH, Duesseldorf (DE)

(72) Inventors: Hajime Inoue, Yokohama (JP); Tadashi Takano, Yokohama (JP)

(73) Assignees: Henkel AG & Co. KGaA, Duesseldorf (DE); Henkel IP & Holding GmbH, Duesseldorf (DE)

(*) Notice: Subject to any disclaimer, the term of this patent is extended or adjusted under 35 U.S.C. 154(b) by 0 days.

(21) Appl. No.: 15/631,223

(22) Filed: Jun. 23, 2017

(65) Prior Publication Data
US 2017/0294396 A1    Oct. 12, 2017

Related U.S. Application Data

(63) Continuation of application No. PCT/JP2014/084764, filed on Dec. 26, 2014.

(51) Int. Cl.
| | |
|---|---|
| H01L 21/00 | (2006.01) |
| H01L 23/00 | (2006.01) |
| B22F 1/00 | (2006.01) |
| H05K 3/32 | (2006.01) |

(52) U.S. Cl.
CPC .......... *H01L 24/29* (2013.01); *B22F 1/0055* (2013.01); *B22F 1/0059* (2013.01); *H01L 24/32* (2013.01); *H01L 24/83* (2013.01); *H01L 2224/04026* (2013.01); *H01L 2224/05639* (2013.01); *H01L 2224/05644* (2013.01); *H01L 2224/05647* (2013.01); *H01L 2224/05655* (2013.01); *H01L 2224/29294* (2013.01); *H01L 2224/29339* (2013.01); *H01L 2224/32245* (2013.01); *H01L 2224/8321* (2013.01); *H01L 2224/8384* (2013.01); *H01L 2224/83192* (2013.01); *H01L 2224/83411* (2013.01); *H01L 2224/83439* (2013.01); *H01L 2224/83444* (2013.01); *H01L 2224/83455* (2013.01); *H05K 3/32* (2013.01); *H05K 2203/1131* (2013.01)

(58) Field of Classification Search
CPC ......... H01L 24/29; H01L 24/32; H01L 24/83; B22F 1/0055; B22F 1/0059
See application file for complete search history.

(56) References Cited

U.S. PATENT DOCUMENTS

2015/0231698 A1* 8/2015 Kurihara ............... B22F 1/02
                                                                252/514

FOREIGN PATENT DOCUMENTS

| JP | 11-26480 A | 1/1999 |
|---|---|---|
| JP | 2006-183072 A | 7/2006 |
| JP | 2006-352080 A | 12/2006 |
| JP | 2009289745 A | 12/2009 |
| JP | 2010018832 A | 1/2010 |
| JP | 4247801 B2 | 3/2010 |
| JP | 2011095244 A | 5/2011 |

(Continued)

*Primary Examiner* — Syed Gheyas
(74) *Attorney, Agent, or Firm* — Taylor M. Coon (57) ABSTRACT

An objective of the present invention is to provide a sinterable bonding material excellent in sinterability. The present invention relates to a sinterable bonding material comprising a silver filler and an organic base compound as a sintering promoter.

7 Claims, 1 Drawing Sheet

(56) References Cited

FOREIGN PATENT DOCUMENTS

| | | | |
|---|---|---|---|
| JP | 2011240406 A | 12/2011 | |
| JP | 2012-52198 A | 3/2012 | |
| JP | 2012-60114 A | 3/2012 | |
| JP | 2013-41884 A | 2/2013 | |
| JP | 2013-149566 A | 8/2013 | |
| JP | 2013216919 A | 10/2013 | |
| JP | 2014055232 A | 3/2014 | |
| JP | 5487301 B2 | 5/2014 | |
| JP | 2014196527 A | 10/2014 | |
| JP | WO 2015060173 A1 * | 4/2015 | ............... H01B 1/22 |

* cited by examiner

SINTERABLE BONDING MATERIAL AND SEMICONDUCTOR DEVICE USING THE SAME

FIELD OF THE INVENTION

The present invention relates to a bonding material. In particular, the present invention relates to a sinterable bonding material comprising an organic base compound as a sintering promoter, and a manufacturing method of the same. The present invention further relates to a semiconductor device manufactured by using the bonding material, and a manufacturing method of the same.

BACKGROUND OF THE INVENTION

Due to size and weight reduction of electronic devices and their improved performance, the amount of heat that generates in a semiconductor device tends to increase. In recent years in a motor controlling field, a power semiconductor having a large band gap such as silicon carbide or gallium nitride has been developed for applications in which high voltage or high current is required such as an electric power device, a vehicle, or a machine tool. Such a power semiconductor can operate at a higher temperature compared with a conventional silicon semiconductor because the semiconductor element itself has high heat resistance.

In order to take advantage of such characteristics of the power semiconductor, a bonding material having an excellent thermal conductivity is required. In recent years, a paste containing nano-sized metal fine particles has been studied as a bonding material having a high thermal conductivity. In a bonding method using such a paste, a sintering phenomenon of metal particles is utilized for the bonding.

A wide variety of studies have been developed for such a bonding method that utilizes sintering of metals. For example, Patent Literature 2 discloses a sintering preform including a carrier having a surface that has at least one structuring element containing hardened paste, wherein the hardened paste contains (a) metal particles having a coating that contains at least one organic compound; and (b) at least one sintering aid. Patent Literature 2 explains that the sintering aid is capable of ensuring a burning off of the coating compounds during the sintering process, and discloses (b1) organic peroxides, (b2) inorganic peroxides, (b3) inorganic acids, (b4) salts of organic acids, (b5) ester of organic acids, and (b6) carbonyl complexes as the sintering aid.

Patent Literature 1: Japanese Patent Laid-Open No. 2006-352080 Patent Literature 2: Japanese Patent Laid-Open No. 2012-60114

However, the sintering aids disclosed in the above Patent Literature 2 are still insufficient in view of their effect on sinterability of bonding materials, and further improvement has been desired.

Accordingly, an object of the present invention is to provide a bonding material excellent in sinterability, thereby a bonding layer having an improved thermal conductivity is provided.

SUMMARY OF THE INVENTION

One aspect of the present invention relates to a sinterable bonding material comprising a silver filler and an organic base compound as a sintering promoter.

The present invention can provide a bonding material excellent in sinterability.

DETAILED DESCRIPTION OF THE INVENTION

<Sintering Promoter>

The bonding material according to the present invention comprises a silver filler and an organic base compound as a sintering promoter.

The organic base compound as a sintering promoter is preferably a nitrogen-containing basic compound. Examples of the nitrogen-containing basic compound include non-cyclic amine compounds, nitrogen-containing hetero ring compounds, phosphazene compounds and the like, and the nitrogen-containing hetero ring compounds are preferable.

Examples of the non-cyclic amine compound include alkylamines, amino-alcohols and alkylene diamines. The non-cyclic amine compound preferably has 1 to 15 carbon atoms, more preferably 1 to 10 carbon atoms. The alkylamine includes mono, di or tri-alkyl amine, and is preferably trialkylamine. Examples of the trialkylamine include trimethylamine, triethylamine, diisopropylethylamine, tributylamine and the like. Examples of the amino-alcohol include mono, di, or tri-alcohol amine such as monoethanolamine, diethanolamine, triethanolamine, 2-amino-2-methyl 1-propanol, diisopropanolamine and triisopropanol amine. Examples of the alkylene diamine include ethylenediamine, hexamethylene diamine and the like.

Examples of the nitrogen-containing hetero ring compound include non-aromatic cyclic amine compounds, nitrogen-containing aromatic hetero ring compounds, nitrogen-containing polycyclic hetero ring compounds and the like.

Examples of the non-aromatic cyclic amine compound include cyclic secondary amine compounds such as ethylene imine (or aziridine), pyrrolidine, piperidine and morpholine; and cyclic tertiary amine compounds such as 1,4-diazabicyclo[2.2.2]octane (DABCO), N-methyl pyrrolidine and N-methyl morpholine.

Examples of the nitrogen-containing aromatic hetero ring compound include pyridine based compounds such as pyridine, picoline, 2,6-lutidine, colidine and dimethylaminopyridine (DMAP); imidazole based compounds; triazole based compounds such as 1,2,3-triazole, 1,2,4-triazole and benzotriazole; bipyridine compounds such as 2,2'-bipyridine and 4,4'-bipyridine; pyrimidine bases; purine bases; and triazine based compounds. The nitrogen-containing aromatic hetero ring compound preferably has a five-membered ring or six-membered ring as a nitrogen-containing moiety. Among these, imidazole-based compounds are preferable.

Examples of the imidazole based compound may include, but not limited to, imidazole and benzimidazole. The imidazole based compounds may have at least one substituent, examples of which include alkyl group having 1 to 4 carbon atoms, hydroxyl group, amino group, phenyl group and the like. The substituent is preferably methyl group or ethyl group, and more preferably methyl group.

Examples of the nitrogen-containing polycyclic hetero ring compound may include 1,8-diazabicyclo[5.4.0]-7-undecene (DBU), 1,5-diazabicyclo [4.3.0]-5-nonene (DBN), 7-methyl-1,5,7-triazabicyclo[4.4.0]dec-5-ene (MTBD), 1,5, 7-triazabicyclo[4.4.0] dec-5-ene (TBD), and the like.

Examples of the phosphazene compound include, but not limited to, phosphazene bases such as BEMP (2-tert-butyl-imino-2-diethylamino-1,3-dimethylperhydro-1,3,2-diaza-phosphorine), tBu-P1 (tert-butylimino-tris(dimethylamino) phosphorane), tBu-P1-t (tert-butylimino-tri(pyrrolidino) phosphorane), Et-P2 (1-ethyl-2,2,4,4,4-pentakis (dimethylamino)-$2\lambda^5,4\lambda^5$-catenadi (phosphazene)), tBu-P4 (1-tert-butyl-4,4,4-tris(dimethylamino)-2,2-bis[tris(dimethylamino)-phosphoranylidenamino]-$2\lambda^5,4\lambda^5$-catenadi (phosphazene)) and the like.

In one embodiment, the nitrogen-containing hetero ring compound is preferably a compound having two or more nitrogen atoms in a molecule, examples of which may include a compound having an amidine moiety and/or a guanidine moiety. Herein, the amidine moiety is a structure in which two nitrogen atoms are bonded to one carbon atom with one single bond and one double bond, respectively. The guanidine moiety is a structure in which three nitrogen atoms are bonded to one carbon atoms with two single bonds and one double bond, respectively. Examples of such a compound include imidazole based compounds, DBU, DBN, MTBD, TBD and the like.

In one embodiment, the pKa of the conjugate acid of the organic base compound of the present invention is preferably 6.0 or more, and more preferably 7.0 or more. Also, a compound having a higher basicity can be preferably used. In such an embodiment, the pKa of its conjugate acid is preferably 9.0 or more, more preferably 10.0 or more, and still more preferably 11.0 or more. Herein, the pKa of the conjugate acid is a value measured at 25° C. in DMSO. Examples of the compound having a conjugate acid pKa of 7.0 or more include, but not limited to, triethylamine, morpholine, N-methyl morpholine, imidazole, N-methyl imidazole, and DMAP. Examples of the compound having a conjugate acid pKa of 11.0 or more include, but not limited to, DBU, DBN, TBD, MTBD, and phosphazene compounds.

Preferably, the organic base compound is not, or scarcely present in the sintered product. From this aspect, the boiling point of the organic base compound is preferably not excessively higher than the sintering temperature of the bonding material of the present invention, more preferably lower than the sintering temperature, and still more preferably lower by more than 100° C. than the sintering temperature.

In one embodiment, in view of its effect on sintering of silver fillers, imidazole based compounds, DBU and DBN are preferable.

The organic base compound may be used singly, or in combination of two or more.

The content of the organic base compound is preferably in the range of 0.01 to 5.0 parts by mass, more preferably 0.05 to 2.0 parts by mass, and still more preferably 0.1 to 1.0 part by mass based on 100 parts by mass of the silver filler.

According to the present invention, the organic base compounds can improve sinterability of the bonding material. The reason therefor has not yet been clearly understood, but it is assumed that the organic base compounds serve to increase the surface activity of silver fillers.

According to the present invention, sinterability of the bonding material can be improved, and as a result, a bonding layer having a lower porosity can be achieved. The thermal conductivity of the bonding layer decreases as the porosity increases. In addition, when the porosity of the bonding layer is excessively high, the state of air-spaces in the bonding layer may change or grow in size during operation of a semiconductor device, particularly during a long-term operation at a high temperature such as 200° C. or more, which may disadvantageously impair long-term reliability of the semiconductor device. According to the present invention using an organic base compound as a sintering promoter, a bonding layer having a low porosity and thereby having an excellent thermal conductivity can be achieved.

<Additive Agent>

The bonding material of the present invention can comprise an additive agent in combination with the above described organic base compounds.

Examples of the additive agent other than the organic base compound include a component capable of promoting the elution and/or the thermal decomposition of the organic substance coating the surface of the silver filler such as an oxidant.

Examples of the oxidant may include organic peroxides, inorganic peroxides, and inorganic acids and the like.

The organic peroxide is a compound having a peroxide anion $O_2^{2-}$ or peroxide group —O—O—, and at least one organic group directly bonded thereto. Examples thereof include diisobutyryl peroxide, cumol peroxyneodecanoate, 1,1,3,3-tetrametylbutyl peroxyneodecanoate, di-n-propyl peroxydicarbonate, tert-amyl peroxyneodecanoate, di-(2-ethylhexyl)-peroxydicarbonate, tert-butyl peroxyneodecanoate, di-n-butyl peroxydicarbonate, 1,1,3,3-tetramethylbutyl peroxypivalate, tert-butyl peroxyneoheptanoate, tert-amyl peroxypivalate, tert-butyl peroxypivalate, di-(3,5,5-trimethylhexanoyl)peroxide, tert-butyl-peroxy-2-ethylhexanoate, tert-butyl peroxyisobutyrate, 1,1-di-(tert-butylperoxy)-3,3,5-trimethylcyclohexane, 1,1-di-(tert-butylperoxy)-cyclohexane, tert-butyl-peroxy-3,5,5-trimethylhexanoate, 2,2-di-(tert-butylperoxy)-butane, tert-butyl peroxyisopropylcarbonate, tert-butyl peroxyacetate, 2,5-dimethyl-2,5-di(2-ethylhexanoylperoxy)-hexane, 1,1,3, 3-tetramethylbutyl peroxy-2-ethylhexanoate, tert-amyl-peroxy-2-ethylhexanoate, tert-butyl peroxydiethylacetate, tert-amyl-peroxy-2-ethylhexylcarbonate, tert-butyl peroxy-2-ethylhexylcarbonate, tert-butyl peroxybenzoate, di-tert-amyl peroxide, 2,5-dimethyl-2,5-di-(tert-butylperoxy)-hexane, tert-butyl cumyl-peroxide, 2,5-dimethyl-2,5-di(tert-butylperoxy)hexyne-3, di-tert-butyl peroxide (Perbutyl D), 3,6,9-triethyl-3,6,9-trimethyl-1,4,7-triperoxonane, di-isopropylbenzene-mono-hydroperoxide, p-menthane hydroperoxide, cumol hydroperoxide, dicumyl peroxide, and 1,1,3, 3-tetramethylbutyl hydroperoxide.

The inorganic peroxide is a compound having a peroxide anion $O_2^{2-}$ or peroxide group —O—O—, and an inorganic group directly bonded thereto. Examples thereof include hydrogen peroxide, ammonium peroxide, monomethylammonium peroxide, dimethylammonium peroxide, trimethylammonium peroxide, monoethylammonium peroxide, diethylammonium peroxide, triethylammonium peroxide, monopropylammonium peroxide, dipropylammonium peroxide, tripropylammonium peroxide, monoisopropylammonium peroxide, diisopropylammonium peroxide, triisopropylammonium peroxide, monobutylammonium peroxide, dibutylammonium peroxide, tributylammonium peroxide, lithium peroxide, sodium peroxide, potassium peroxide, magnesium peroxide, calcium peroxide, barium peroxide, ammonium perborate, lithium perborate, potassium perborate and sodium perborate.

In the present invention, the organic peroxide and the inorganic peroxide preferably have a decomposition temperature (1 hour half-life temperature) of 200° C. or less.

Examples of the inorganic acid include phosphate compounds such as orthophosphoric acid, pyrophoric acid, metaphosphoric acid, and polyphosphoric acid.

A component promoting the reduction of the silver oxide which may be present on the surface of the silver filler is also preferably used as the additive agent.

Examples of the component promoting the reduction of the silver oxide include an alcohol compound and a carboxylic compound. Examples of the alcohol compound may include a polyhydric alcohol such as citric acid, ascorbic acid, and glucose. Examples of the carboxylic compound may include primary carboxylic acid such as alkyl carboxylic acid, secondary carboxylic acid, and tertiary carboxylic acid; dicarboxylic acid; and a carboxyl compound having a cyclic structure. An organic acid salt, an organic acid ester, and a carbonyl complex or the like which emits or generates carbon monoxide during sintering can also be used as the component promoting the reduction of silver oxide.

The additive agents may be used singly or in combination of two or more.

When the additive agent other than the organic base compound is used, the content of the additive agent is preferably 0.01 to 5.0 parts by mass, more preferably 0.05 to 2.0 parts by mass, and still more preferably 0.1 to 1.0 part by mass based on 100 parts by mass of the silver filler.

<Silver Filler>

The silver filler is a main component of the bonding material according to the present invention. The silver fillers in the bonding material fuse together (sinter) by heating to form a silver sintered product, and thereby a bonding layer having an excellent thermal conductivity and bonding strength is formed.

The content of the silver filler of the bonding material according to the present invention is preferably 75% by mass or more of the total mass of solid components in the bonding material, more preferably 85% by mass or more, still more preferably 90% by mass or more, and may be even more preferably 95% by mass or more. The uppermost limit of the content is not particularly limited and may be 100% by mass of the total mass of solid components in the bonding material. The "solid component" herein refers to all the components in the bonding material excluding components which vanish from the bonding layer by heating, in other words, all the components that remain in a sintered product after sintering. A bonding material having superior bonding strength and thermal conductivity is obtained as the content of the silver filler is increased.

The silver filler preferably has a central particle diameter of 1 nm to 50 μm. The central particle diameter of the silver filler is more preferably 10 nm to 30 μm, and still more preferably 100 nm to 20 μm. When the particle diameter of the silver filler is within the above range, the sinterability of the filler can be more improved. In addition, the fillers are well dispersed in the bonding material, which can improve the preservation stability of the bonding material, and provide an uniform bonding strength. Herein, the "central particle diameter" of the silver filler represents a median diameter (50% particle diameter: D50) in a volume-basis particle size distribution curve obtained by measurement with a laser diffraction particle size analyzer.

The shape of the silver filler is not particularly limited, and examples of which include a spherical-shaped, approximately spherical-shaped, elliptical spherical-shaped, spindle-shaped, cube-shaped, approximately cube-shaped, flake-shaped, and unshaped-shaped. Among them, from the viewpoint of preservation stability, the spherical-shaped, approximately spherical-shaped, and flake-shaped fillers are preferably used.

In one embodiment, the flake-shaped filler is still more preferable. Examples of the flake-shaped filler may include plate-shaped, lamellar-shaped, and scale-shaped fillers. Preferable examples of the flake-shaped filler include a particle having a thin plate shape in a side direction, and a circular shape, an elliptical shape, a polygonal shape, or an unshaped shape in a front face direction. The filler having such a shape has excellent heating sinterability because of a high contact area between the fillers, which can reduce porosity in a sintered product.

The content of the flake-shaped filler is preferably 30% by mass or more of the silver filler, more preferably 50% by mass or more, and still more preferably 60% by mass or more, and further more preferably 70% by mass or more of the silver filler. In one embodiment, the content of the flake-shaped filler is preferably 80% by mass or more, more preferably 90% by mass or more, and may be 100% by mass. When the flake-shaped filler is contained in the above range, a sintered product having a low porosity and an excellent thermal conductivity can be formed.

A preferable example of the flake-shaped filler will be described below.

In the present invention, a flake-shaped filler having a smooth surface is particularly preferable. Since such a filler has a flat surface, the contact area between the fillers is more increased, which realize an excellent sinterability and thereby provides a bonding layer having an excellent thermal conductivity. In addition, since the filler has a smooth surface, the filler has excellent dispersibility, and thereby a bonding layer having homogeneous bonding strength can be formed.

Herein, when the filler has a smooth surface, an arithmetic average roughness (Ra) of the surface is preferably 20 nm or less, and more preferably 10 nm or less. From the viewpoints of dispersibility of the filler and the thermal conductivity of the bonding layer obtained therefrom, the arithmetic average roughness (Ra) of the filler is preferably 8.5 nm or less, more preferably 5 nm or less, and still more preferably 3.5 nm or less. Considering the ease of manufacturing, the arithmetic average roughness (Ra) of the filler is preferably 1 nm or more.

Herein, the arithmetic average roughness (Ra) can be measured with an atomic force microscope (AFM). The AFM traces a sample surface using a probe attached to a tip of a cantilever, or scans the sample surface maintaining a constant distance between the probe and the sample surface. The concavo-convex shape of the sample surface is evaluated by measuring vertical displacement of the cantilever. The measurement conditions are as follows.

Mode: Contact Mode

Cantilever: OMCL-TR800PSA-1 manufactured by Olympus Corporation

Height-Directional Resolution: 0.01 nm

Lateral-Directional Resolution: 0.2 nm

Furthermore, the flake-shaped filler having the smooth surface is preferably a crystalline filler. The crystalline flake-shaped filler has excellent sinterability, which can provide excellent bonding strength. The crystal may be a single crystal or a polycrystal. From the viewpoint of the smoothness of the surface, the crystal is more preferably a single crystal. The crystalline silver filler can be confirmed by X-ray diffraction analysis or the like.

The flake-shaped filler preferably has a central particle diameter (D50) of 0.05 μm or more and 20 μm or less.

Particles having a central particle diameter of 0.05 µm or more are easily manufactured, and particles having a central particle diameter of 20 µm or less have excellent sinterability. The central particle diameter is more preferably 15 µm or less, and still more preferably 8 µm or less, and in one embodiment, 5 µm or less may be particularly preferable. The central particle diameter is more preferably 0.1 µm or more, and still more preferably 0.3 µm or more.

The standard deviation (OD) of the particle diameter is preferably 10 µm or less, more preferably 8 µm or less, and still more preferably 4 µm or less. Herein, the standard deviation (OD) of the particle diameter is a value calculated based on particle diameters of 100 particles selected at random.

The average thickness (T) of the particles is preferably 1 nm or more and 100 nm or less. Particles having an average thickness of 1 nm or more can be more easily manufactured, and particles having an average thickness of 100 nm or less can provide a sintered product having an excellent thermal conductivity. The average thickness is more preferably 80 nm or less, and still more preferably 50 nm or less. The average thickness is more preferably 10 nm or more, and still more preferably 20 nm or more. Herein, the average thickness (T) of the particles is an average value of thicknesses of 100 particles selected at random. The thicknesses of the particles can be measured based on a scanning electron microscope (SEM) photograph, visually or by using an image-analysis software.

The aspect ratio (central particle diameter (D50)/average thickness (T) of particles) of the flake-shaped filler is preferably 20 or more and 1000 or less. The aspect ratio is more preferably 30 or more, and still more preferably 35 or more. The aspect ratio is more preferably 500 or less, still more preferably 200 or less, and particularly preferably 100 or less.

The silver filler that can be used for the present invention can be manufactured by a known method such as a reduction method, a milling method, an electrolysis method, an atomization method, or a heat treatment method. Examples of a method for manufacturing a flake-shaped filler such as those described above include a method described in Japanese Patent Laid-Open No. 2014-196527. The entire disclosure thereof is incorporated herein by reference.

In one embodiment, the surface of the silver filler may be coated with an organic substance.

The amount of the organic substance is preferably 0.01 to 10% by weight, and more preferably 0.1 to 2% by weight of the silver filler. It is also preferable to adjust the amount of the organic substance according to the shape of the silver filler or the like. The amount of the organic substance can be measured by volatilizing or thermally decomposing the organic substance by heating, and measuring a weight decrease, for example.

Herein, the state where a silver filler is "coated with the organic substance" includes a state where an organic solvent is adhered to the surface of a silver filler by dispersing the silver filler in the organic solvent.

Examples of the organic substance coating the silver filler may include a hydrophilic organic compound such as an alkyl alcohol having 1 to 5 carbon atoms, an alkanethiol having 1 to 5 carbon atoms, and an alkane polyol having 1 to 5 carbon atoms, or a lower fatty acid having 1 to 5 carbon atoms; and a hydrophobic organic compound such as a higher fatty acid having 15 or more carbon atoms and its derivatives, a middle fatty acid having 6-14 carbon atoms and its derivatives, an alkyl alcohol having 6 or more carbon atoms, an alkylamine having 16 or more carbon atoms, or an alkanethiol having 6 or more carbon atoms.

Among them, the higher fatty acid, the middle fatty acid, and their metal salts, amide, amine, or ester compounds are preferable. The hydrophobic (water-repellent) organic compound is more preferably a higher or middle fatty acid, or its water-repellent derivatives. In view of its coating effect, the higher or middle fatty acid is particularly preferable.

Examples of the higher fatty acid include a straight-chain saturated fatty acid such as pentadecanoic acid, hexadecane acid, heptadecanoic acid, octadecanoic acid, 12-hydroxy octadecanoic acid, eicosanoic acid, docosanoic acid, tetracosanoic acid, hexacosanoic acid (cerinic acid), or octacosanoic acid; a branched saturated fatty acid such as 2-pentyl nonanoic acid, 2-hexyl decanoic acid, 2-heptyl dodecanoic acid, or isostearic acid; and an unsaturated fatty acid such as palmitoleic acid, oleic acid, isooleic acid, elaidic acid, linoleic acid, linolenic acid, recinoleic acid, gadoleic acid, erucic acid, and selacholeic acid.

Examples of the middle fatty acid include a straight-chain saturated fatty acid such as hexanoic acid, heptanoic acid, octanoic acid, nonanoic acid, decanoic acid, undecanoic acid, dodecanoic acid, tridecanoic acid, or tetradecanoic acid; a branched saturated fatty acid such as isohexanoic acid, isoheptanoic acid, 2-ethylhexanoic acid, isooctane acid, isononanoic acid, 2-propyl heptanoic acid, isodecanoic acid, isoundecanoic acid, 2-butyl octanoic acid, isododecanoic acid, and isotridecanoic acid; and an unsaturated fatty acid such as 10-undecenoic acid.

Examples of a method for manufacturing a silver filler having a surface coated with an organic substance include, but are not particularly limited to, a method for manufacturing a silver filler in the presence of an organic solvent by a reductive method. Specifically, the silver filler can be obtained by mixing a carboxylic acid silver salt with a primary amine, and depositing a silver filler using a reducing agent in the presence of an organic solvent, as described in Japanese Patent Laid-open Nos. 2006-183072 and 2011-153362 or the like, for example. In addition, the silver filler can be obtained by a method described in Japanese Patent Laid-open No. 2014-196527 comprising a step of dispersing silver oxalate by using a carrier medium such as water or alcohol, and a dispersion medium such as glycols, followed by applying heat and/or pressure. The flake-shaped filler manufactured as such can be preferably used in combination with the sintering promoter of the present invention. The entire disclosure of the above applications is incorporated herein by reference.

It is also preferable to disperse the obtained silver filler in a solvent used for manufacturing the filler, and add the dispersion directly to the bonding material of the present invention.

In addition, the surface of the silver filler may be coated with organic substance layers of two or more. Such a filler can be obtained, for example, by dispersing the above manufactured silver filler having a coating of an organic substance into other organic solvents. A solvent to be added to the bonding material of the present invention can be preferably used as such "other solvents".

When the surface of the silver filler is coated with the organic substance, the aggregation of the silver filler in the bonding material can be more prevented or reduced. In addition, the organic substance on the surface of the filler may be eluted, volatilized, or thermally decomposed when heated to expose a silver surface, and as a result, the sinterability of the filler can be more increased.

In one embodiment, the silver filler may be a silver oxide particle or a particle having a silver oxide layer at least on its surface. When such a silver filler is used, the silver surface is exposed by reduction of silver oxide when sintering, and thereby the sinterability can be more increased.

The silver fillers may be used singly or in combination of two or more. Combination of fillers in different shapes or in different sizes may reduce porosity of the sintered product. Examples of the combination include, but not limited to, a mixture of a flake-shaped filler, and an approximately spherical-shaped filler having a central particle diameter smaller than that of the flake-shaped filler. The content the approximately spherical-shaped filler may be in the range of 1 to 50 wt % by mass, and more preferably 5 to 30 wt % by mass of the silver filler.

In one embodiment, the bonding material according to the present invention can also comprise a filler of other metals in place of a portion of the silver filler. Examples of the metal other than silver include copper, gold, tin, zinc, titanium, and alloys and oxides of these metals, and among them, copper and an alloy containing copper are preferable.

Preferable examples of the particle diameter, shape, and surface coating of such metal fillers include the same as those exemplified in the above silver filler. The content of the metal filler other than silver filler is preferably 0 to 30% by mass, more preferably 1 to 20% by mass of the silver filler.

<Solvent>

The bonding material of the present invention can further comprise a solvent that vaporizes or vanishes at a sintering temperature or less of the bonding material.

The solvent can adjust the flowability of the bonding material to improve the workability. The solvent may also have an effect of improving the sinterability of the silver filler by volatilizing during sintering and/or removing an organic layer coating the silver filler. A compound having an effect of promoting the reduction of the silver oxide layer is also preferably used as the solvent.

The boiling point of the solvent used in the present invention is preferably 60° C. or more and 300° C. or less. When the boiling point is in the above range, volatilization of the solvent during the manufacturing process or remaining of the solvent after sintering can be suppressed.

Examples of the solvent include, but not limited to, alcohols such as aliphatic alcohols, alicyclic alcohols, aromatic alcohols, and poly-hydric alcohol; glycol ethers; glycol esters; glycol ether esters; aliphatic and/or aromatic hydrocarbons; esters; ethers; amides; and cyclic ketones. Specific examples of the solvent include, but not particularly limited to, methyl carbitol, ethyl carbitol, propyl carbitol, butyl carbitol (BC), dipropylene glycol monomethyl ether (DPGME), triethylene glycol dimethyl ether, methyl cellosolve, ethyl cellosolve, or butyl cellosolve, ethyl carbitol acetate, butyl carbitol acetate (BCA), methyl cellosolve acetate, or ethyl cellosolve acetate, ethylene glycol, dipropylene glycol (DPG), polyethylene glycol, cyclooctanone, cycloheptanone, cyclohexanone, benzyl alcohol, glycerin, butyl ethoxyethyl acetate, propylene carbonate, tetrahydrofuran, diethyl eter, γ-butyrolactone, isophorone, glycidyl phenyl ether, terpineol, dimethylformamide, dimethylacetamide, N-methylpyrrolidone or the like.

The solvents may be used singly or in combinations of two or more.

The amount of the solvent to be added is not particularly limited, and preferably in the range of 0.5 part by mass or more and 20 parts by mass or less, more preferably 1 part by mass or more and 15 parts by mass or less, and still more preferably 2 parts by mass or more and 10 parts by mass or less based on 100 parts by mass of the silver filler. In one embodiment, the amount is preferably 8 parts by mass or less, and more preferably 6 parts by mass or less. When the amount of the solvent is in the above range, a shrinkage ratio in a drying or sintering step after applying can be more reduced, while maintaining an improved workability during manufacturing.

The bonding material according to the present invention has a viscosity of preferably in the range of 5000 to 150,000 mPa·s, and more preferably in the range of 8,000 to 100,000 mPa·s. The bonding material preferably has a thixotropic index in the range of 1.0 to 5.0. When the viscosity and the thixotropic index are within the above range, the workability of the bonding material can be more improved. Herein, the viscosity represents a value measured under conditions of no. 7 spindle/10 rpm/25° C. using a brookfield viscosity meter (RV DV-II). The thixotropic index is a value calculated as a ratio of a viscosity at 0.5 rpm/a viscosity at 5 rpm measured likewise.

Furthermore, the present invention can be suitably applied for a bonding material that further comprises a component other than sinterable metal such as inorganic fine particles, a resin, an antioxidant, a stabilizing agent, a dispersing agent, and a thixotropic property imparting material or the like.

The bonding material according to the present invention can be manufactured by introducing the silver filler and the organic base compound as a sintering promoter, and optionally the solvent, the additive agent and the like into a mixer such as a bead mill, a grinder, a pot mill, a three-roll mill, a rotary mixer, or a twin-screw mixer, and mixing these.

The bonding layer is formed by applying the bonding material according to the present invention to a desired portion of a member to be bonded, and heating them.

According to one embodiment of the present invention, a bonding layer having a lower porosity can be achieved. For example, the porosity of the bonding layer can be 10% or less, preferably 6% or less, and more preferably 4% or less. However, the porosity can vary depending on a component comprised in the bonding material, the sintering condition, or the like.

Herein, the porosity is an average value over the bonded area (the area sandwiched between the two members to be bonded), and can be measured as follows and explained in details in Examples.

1. Polish the bonded article with a polisher to expose a cross-sectional surface of the bonded layer.

2. Take more than ten SEM Images of the surface from one end of the bonded area to another end.

3. Import the images into a microscope, extract air-spaces in the image by luminance extraction, and calculate the proportion of an area of the air-spaces. Porosity of the bonded area is calculated as an average of the porosities of all the images taken.

According to one embodiment of the present invention, a bonding layer having a high thermal conductivity can be obtained. For example, the thermal conductivity of the bonding layer can be 200 W/mK or more, and preferably 230 W/mK or more. In a preferable embodiment, the thermal conductivity of the bonding layer can be 280 W/mK or more, and preferably 300 W/mK or more. However, the thermal conductivity can vary depending on a component comprised in the bonding material, the sintering condition, or the like. Herein, the thermal conductivity can be determined by a method using a laser-flash calorimeter with reference to JIS R1611-2010, the details of which are explained in Examples.

The thickness of the bonding layer can be suitably set to exhibit required bonding strength in accordance with applications, and for example, the thickness can be set to 40 to 100 µm.

The bonding material according to the present invention can be suitably used for various applications, and is particularly suitable for bonding elements of a power semiconductor for which high heat-release characteristics, an improved bonding strength and a high reliability at a high temperature operation are required.

A method for manufacturing a bonded article using a bonding material according to the present invention includes the steps of:

providing two members to be bonded;

disposing the two members and a bonding material so that surfaces to be bonded of the two members face to each other with the bonding material according to the present invention disposed therebetween; and heating the two members with the bonding material disposed therebetween to a predetermined temperature.

As one aspect of the bonded article using the bonding material according to the present invention, a semiconductor device and a manufacturing method of the same will be described.

Figure 1:
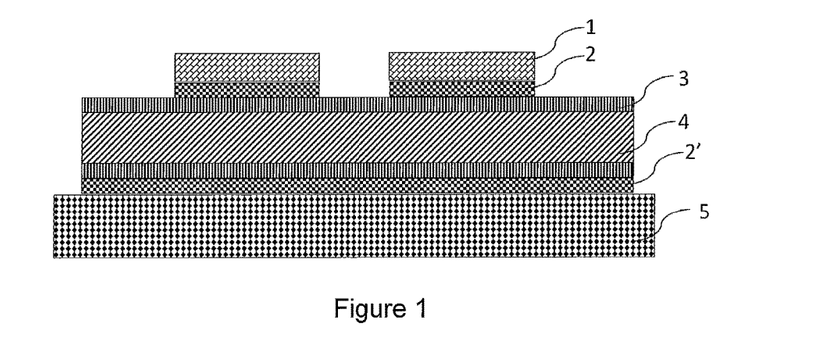
FIG. 1 is a partial cross-sectional view of a semiconductor device according to one embodiment of the present invention.

FIG. 1 is a partial cross-sectional view of a semiconductor device according to one embodiment of the present invention. The semiconductor device includes a semiconductor chip (1) and a substrate (4) wherein the semiconductor chip (1) and a metal surface of the substrate (3) are bonded to each other by a bonding layer (2) obtained by sintering the bonding material according to the present invention. The semiconductor device can further include a cooling plate (5) wherein the semiconductor chip (1) and the metal surface of the substrate (3), and/or the metal surface of the substrate (3) and the cooling plate (5) are bonded to each other by a bonding layer (2 and/or 2') obtained by sintering the bonding material according to the present invention.

(Member to be Bonded)

The semiconductor chip is not particularly limited. Examples thereof may include, but are not limited to, a Si chip and a SiC chip. The back side (the surface to be bonded) of the semiconductor chip is preferably metal-plated with silver, copper, nickel, and gold or the like. Examples of the shape of the semiconductor chip include, but are not particularly limited to, a square and a rectangle which have a height and a width of about 2 mm to about 15 mm.

Examples of the substrate include, but are not particularly limited to, a metal substrate, a ceramic substrate, and a substrate having a structure in which a metal layer and a ceramic layer are layered in a sandwich structure. The surface of the substrate (the surface to be bonded) is preferably a metal. For example, a metal-plated substrate such as a silver-plated substrate, a gold-plated substrate, a nickel-plated substrate, or a tin-plated substrate; and a metal substrate such as a copper substrate or an aluminum substrate can be suitably used. Specific examples may include DBU substrate, DBA substrate, AMB substrate and the like but are not limited thereto.

(Method for Manufacturing Semiconductor Device)

A method for manufacturing a semiconductor device according to the present embodiment includes the steps of:
(1) applying the bonding material according to the present invention on a substrate,
(2) placing a semiconductor chip on the substrate, and
(3) heating the substrate on which the semiconductor chip is placed.

In the above step (1), the method for applying the bonding material on the substrate is not particularly limited, and a dispense method and a screen printing method or the like can be used.

In the above step (2), a known method may be used as the method for placing (mounting) the semiconductor chip on the substrate. The above step (2) may also include the step of positioning the semiconductor chip, and the step of adjusting the thickness of the bonding material applied, or the like.

In the above step (3), the method of heating can be appropriately selected according to the bonding material or the member to be bonded.

An example of sintering profile, but not limited to, includes:

Drying step: 90° C. or more, 15 minutes or more
Sintering temperature: 250° C. or more, for example, 300° C.
Pressure: 10 MPa or more
Time: 3 minutes to 5 minutes In another embodiment, a sintering profile in which a low or no pressure is applied can be suitably used due to the improved sintering ability of the bonding material of the present invention. A low or no pressure at sintering process may have an effect of increasing productivity, or improving quality of the semiconductor device by reducing the stress at die bonding process.

The bonding material according to the present invention can be used for various applications such as an electronic part, an electronic device, an electric part, and an electric device. For example, the bonding material can be suitably used to bond a chip component and a circuit substrate of for example a capacitor or a resistor; a semiconductor chip and a lead frame or a circuit substrate of for example a diode, a memory, an IC, or a CPU; and a high heat generating CPU chip and a cooling plate.

EXAMPLES

Hereinafter, the present invention will be described with Examples for the purpose of describing the present invention in more detail. These Examples are used for describing the present invention, and do not limit the present invention at all.

Materials used in the present Examples will be shown below. If not otherwise specified, commercially available high-purity products were used as reagents.

<Silver Filler>
a mixture of a flake-shaped filler (aspect ratio=20-200, Ra 10 nm) and a spherical-shaped filler, D50=0.79 µm
<Additive>
Perbutyl D (di-tert-butylperoxide)
Comparative compound 1: HOOC—$(CH_2)_n$—COOH (n=4 to 5)
Comparative compound 2: HOOC—$(CH_2)_n$—COOH (n=1 to 3)
Imidazole (1,3-diaza-2,4-cyclopentadiene)
DBU (1,8-diazabicyclo[5.4.0]undec-7-ene)
<Solvent>
BC (butyl carbitol)
BCA (butyl carbitol acetate)
DPG (dipropylene glycol)

Example I

Silver filler 1: 90.24 wt %, an additive agent shown in Table 1: 0.2 wt %, and a solvent (BCA/DPG=1/1 (mass ratio)): 9.56 wt % were mixed to prepare a bonding material.

The obtained bonding material was printed at a thickness of 100 μm on a substrate (a silver-plated copper lead frame, 25×25 mm, a thickness of 0.3 mm). A semiconductor chip (backside silver-plated Si die, 5×5 mm) was mounted on the substrate. The substrate with the chip was heated under the conditions of 250° C./60 minutes/no pressure in an oven to obtain a test piece for evaluation. A porosity of the bonding layer of the test piece was determined as follows.

(Porosity Determination)
1. Polishing of the Test Piece:
   Device: BUEHLER Beta GRINDER-POLISHER 60-1990
   Polishing papers: Struers SiC Paper #120, #220, #500, #800, #1200, #2000
   Buff: Struers DP-Nap Size: 200 mm dia
   Diamond spray: Struers DP-Spray P 1 μm, ¼ μm
   The test piece was polished with polishing papers #120, #220, #500, #800, #1200, #2000, Buff, Diamond spray 1 μm, ¼ μm in turn to expose a cross sectional surface of the bonding layer.
2. SEM Imaging:
   SEM Images of the cross sectional surface of the bonding layer were taken by using Scanning Electron Microscope (HITACHI S-3000, magnification=2000 fold, 1280×960 dpi, 15 images from right edge to left edge of the bonded area).
3. Porosity Calculation:
   The obtained images were imported into a microscope (Keyence Digital Microscope VHX-500), air-spaces were extracted by luminance extraction, and porosity was determined as a proportion of the area of air-spaces in the image. The average porosity was calculated by averaging the porosities of 15 images. The results are shown in Table 1.

TABLE 1

|  | Example | | Comparative Example | | | |
|---|---|---|---|---|---|---|
|  | 1 | 2 | 1 | 2 | 3 | 4 |
| Promoter | imidazole | DBU | none | Perbutyl D | Comparative compound 1 | Comparative compound 2 |
| Porosity (%) | 9 | 7 | 10 | 10 | 16 | 12 |

As shown in Table 1, a porosity lower than 10% was achieved in Examples 1 and 2, which indicates that an organic base compound can improve the sinterability of the bonding material when used as a sintering promoter.

(Heat Generation Characteristics)

The heat generation characteristics of the obtained bonding materials were analyzed by differential scanning calorimetry (DSC) (a temperature rising speed of 10° C./min). The results are shown in FIG. 2.

Figure 2:
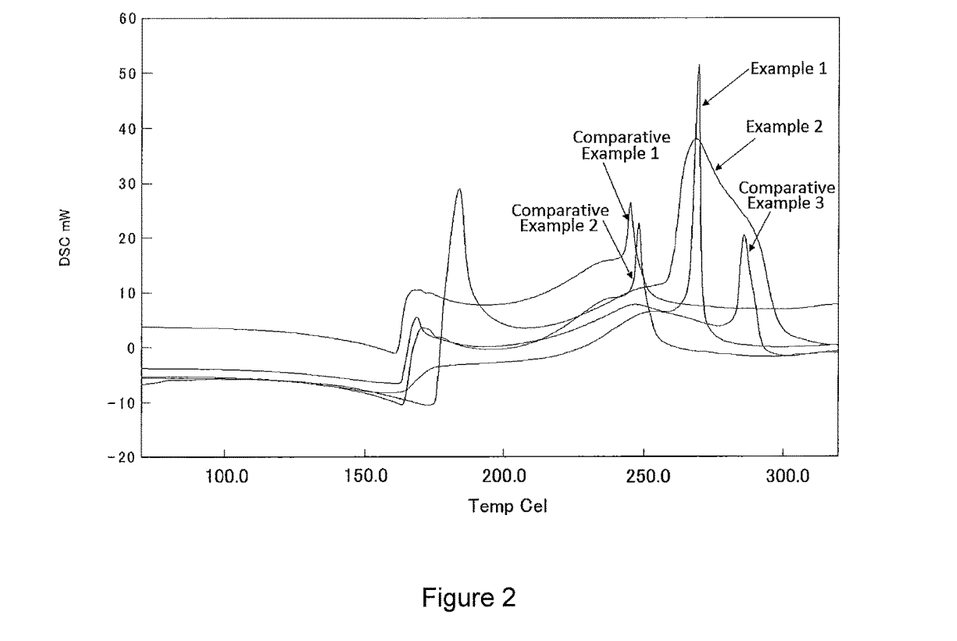
FIG. 2 is the DSC chart of the bonding materials in Example.

As shown in FIG. 2, distinctive exothermic peaks were observed in Examples 1 and 2, which suggests that the organic base compounds used as a sintering promoter enhanced the activation of the silver filler surface by, for example, accelerating the degradation of its coating substance.

Example II

Silver filler 1: 90.24 wt %, DBU as a sintering promoter: 0.2 wt %, and a solvent shown in Table 2: 9.56 wt % were mixed to prepare a bonding material.

The obtained bonding material was printed at a thickness of 100 μm on a substrate (silver-plated copper DBC, 25×25 mm, a thickness of 1 mm). The semiconductor chip (backside silver-plated Si die, 5×5 mm) was mounted on the substrate. The substrate with the chip was dried at 90° C. for 30 minutes, and heated under conditions of 250° C./5 minutes/10 MPa in an oven to obtain a test piece for evaluation. A porosity of the bonding layer of the test piece was determined as described above. The results are shown in Table 2.

TABLE 2

|  | Example 3 | Example 4 |
|---|---|---|
| Solvent | BCA/DPG 1/1 | BCA |
| Porosity (%) | 2.4 | 1.9 |

As shown in Table 2, a lower porosity was achieved also in a case where different solvents were used, and the bonding materials were sintered under pressure.

Example III

Silver filler (a mixture of a flake-shaped filler (aspect ratio=20~200, Ra≤10 nm) and a spherical-shaped filler, D50=0.45 μm): 94.9 wt %, DBU as a sintering promoter: 0.2 wt %, and BC: 4.9 wt % were mixed to prepare a bonding material (Example 5).

The obtained bonding material was printed at a thickness of 100 μm between two substrates (silver-plated copper having a thickness of 500 μm, 5 mmφ). The two substrates with the bonding material were dried at 90° C. for 30 minutes, and heated under conditions of 300° C./5 minutes/10 MPa in an oven to obtain a test piece for evaluation. The thickness of the bonding layer after sintering was about 40 to 60 μm, and of the obtained test piece (i.e., the thickness of the two substrates and the bonding layer) was about 1.0 to 1.1 mm.

(Measurement of Thermal Conductivity)

The obtained test piece was placed in Kyoto Denshi Kogyo LFA-502, and the thermal conductivity of the thickness direction was determined by measuring thermal diffusivity ($\alpha$ (m$^2$/s)), specific heat capacity (c(J/gK)), and material density ($\rho$ (g/m$^3$)) at room temperature (23±1° C.), and the thermal conductivity ($\lambda$ (W/mK)) was calculated by the relation: $\lambda = \alpha c \rho$. As the reference, thermal conductivity of a silver-plated copper plate having a thickness of 1 mm was measured in the same manner as above, which was 380 W/mK.

The thermal conductivity of the bonding layer of Example 5 was 280 W/mK.

These results demonstrate that the use of the organic base compound as a sintering promoter can improve the sinterability of bonding materials, and as a result, a bonding layer having a low porosity and a high thermal conductivity is formed.

INDUSTRIAL APPLICABILITY

A bonding material according to the present invention can be applied to an electronic component, an electronic device, an electric component, and an electric device or the like. In particular, the bonding material can be usefully used to bond a chip component and a circuit substrate of a capacitor, a resistor or the like; a semiconductor chip, and a lead frame or a circuit substrate of a diode, a memory, an IC, a CPU or the like; and a high-heat-generating CPU element and a cooling plate.

EXPLANATION OF SYMBOLS

1: semiconductor chip
2, 2': bonding layer
3: metal surface of substrate
4: substrate
5: cooling plate

The invention claimed is:

1. A sinterable bonding material comprising a silver filler and an organic base compound as a sintering promoter, wherein the silver filler comprises a flake-shaped filler, and wherein the organic base compound is a nitrogen containing hetero ring compound having an amidine moiety and/or a guanidine moiety.

2. The sinterable bonding material according to claim 1, wherein the pKa of the conjugate acid of the organic base compound is 7.0 or more.

3. The sinterable bonding material according to claim 1, wherein the organic base compound is at least one selected from the group consisting of substituted or unsubstituted imidazoles, 1,8-diazabicyclo[5.4.0]-7-undecene, and 1,5-diazabicyclo[4.3.0]-5-nonene.

4. The sinterable bonding material according to claim 1, wherein the silver filler having an arithmetic average roughness (Ra) of 10 nm or less.

5. The sinterable bonding material according to claim 1, further comprising a solvent.

6. The semiconductor device manufactured by using the sinterable bonding material according to claim 1.

7. A method for manufacturing a semiconductor device comprising the steps of:
    providing two members to be bonded;
    disposing the two members and a bonding material so that surfaces to be bonded of the two members face to each other with the bonding material disposed therebetween; and
    heating the two members, with the bonding material disposed therebetween to a predetermined temperature,
    wherein the bonding material is a sinterable bonding material comprising a silver filler and an organic base compound as a sintering promoter, wherein the silver filler comprises a flake-shaped filler, and wherein the organic base compound is a nitrogen containing hetero ring compound having an amidine moiety and/or a guanidine moiety.

* * * * *

UNITED STATES PATENT AND TRADEMARK OFFICE
CERTIFICATE OF CORRECTION

PATENT NO. : 10,141,283 B2
APPLICATION NO. : 15/631223
DATED : November 27, 2018
INVENTOR(S) : Hajime Inoue and Tadashi Takano It is certified that error appears in the above-identified patent and that said Letters Patent is hereby corrected as shown below:

Column 4, Line 24: Change "1,1,3,3-tetrametylbutyl" to "1,1,3,3-tetramethylbutyl".

Column 7, Line 9: Change "(OD)" to "($\delta$D)".

Column 7, Line 12: Change "(OD)" to "($\delta$D)".

Column 12, Line 49: Change "Ra 10 nm" to "Ra$\leq$ 10 nm".

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*